United States Patent [19]
Trontelj

[11] Patent Number: 6,031,369
[45] Date of Patent: Feb. 29, 2000

[54] ELECTRICITY METER HAVING CIRCUITRY FOR SELECTING THE CONDITIONING OF A POWER SIGNAL ACCORDING TO THE POLARITY OF AN A.C. MAINS SIGNAL

[75] Inventor: Janez Trontelj, Ljubljana, Slovenia

[73] Assignee: Horstmann Timers & Controls Limited, United Kingdom

[21] Appl. No.: 08/913,501

[22] PCT Filed: Mar. 8, 1996

[86] PCT No.: PCT/GB96/00541

§ 371 Date: Sep. 16, 1997

§ 102(e) Date: Sep. 16, 1997

[87] PCT Pub. No.: WO96/28740

PCT Pub. Date: Sep. 19, 1996

[30] Foreign Application Priority Data

Mar. 16, 1995 [GB] United Kingdom .................... 9505313
Mar. 16, 1995 [GB] United Kingdom .................... 9505314

[51] Int. Cl.[7] .......................... G01R 21/133; G01R 21/08
[52] U.S. Cl. ....................... 324/142; 324/111; 324/117 H
[58] Field of Search ............................... 324/103 R, 111, 324/117 R, 117 H, 118, 120, 126, 140 R, 141, 142

[56] References Cited

U.S. PATENT DOCUMENTS

| | | | |
|---|---|---|---|
| 3,747,605 | 7/1973 | Cook | 324/142 X |
| 3,955,138 | 5/1976 | Milkovic | 324/142 X |
| 4,224,671 | 9/1980 | Sugiyama et al. | 324/142 X |
| 4,525,669 | 6/1985 | Holberton et al. | 324/142 |
| 4,749,941 | 6/1988 | Halder et al. | 324/142 |
| 4,972,141 | 11/1990 | Rozman et al. | 324/142 |

FOREIGN PATENT DOCUMENTS

| | | |
|---|---|---|
| 0 246 401 | 2/1987 | European Pat. Off. . |
| 2 205 425 | 12/1988 | United Kingdom . |

*Primary Examiner*—Gerard Strecker
*Attorney, Agent, or Firm*—Fish & Richardson P.C.

[57] ABSTRACT

An electricity meter including a circuit which receives a first A.C. signal having a magnitude dependent on power passing through a conductor, and a mains A.C. signal. While the mains signal is positive, first pulses are generated at a rate dependent on the first A.C. signal. While the mains signal is negative, second pulses are generated at a rate dependent on the first A.C. signal. Pulses are counted over time, the sum of pulse counts being a measure of energy used.

20 Claims, 3 Drawing Sheets

ELECTRICITY METER HAVING CIRCUITRY FOR SELECTING THE CONDITIONING OF A POWER SIGNAL ACCORDING TO THE POLARITY OF AN A.C. MAINS SIGNAL

The present invention relates to an electricity meter and method of metering.

BACKGROUND OF THE INVENTION

In an Alternating Current (A.C.) ENERGY (J) meter a signal proportional to instantaneous POWER (W) is applied to an INTEGRATOR which outputs a pulse whenever a predetermined unit of energy is measured. The following equations apply:

$$J = \int W dt \quad \text{where} \quad W = \text{Instantaneous Power}$$

$$t = \text{Time}$$

$$J = \text{Energy}$$

$$W = V \cdot \text{Sin}\emptyset \cdot I \cdot \text{Sin}\emptyset \quad \text{where} \quad W = \text{Instantaneous Power (IP)}$$

$$V = \text{Peak Voltage}$$

$$I = \text{Peak Voltage}$$

$$\emptyset = 2\pi f t$$

$$f = \text{Frequency}$$

FIG. 1 (prior art) shows a typical example of the instantaneous power signal derived from the multiplication of voltage and current signals.

This instantaneous power signal IP as shown in FIG. 1 (prior art) is then typically applied to the input of an integrator as shown in FIG. 2 (prior art). This integrator comprises a capacitor C, a Window Comparator, pulse generation logic and a capacitor discharge switch S.

The power input signal IP is applied to the capacitor C. The capacitor C either charges or discharges to one of two thresholds of the window comparator. If the upper threshold of the window comparator is reached the positive output '±' of the comparator is activated. The Pulse logic circuit outputs a pulse to indicate a unit of forward energy and closes switch S for a set period of time to discharge the capacitor C. Switch S is opened and the process repeats. If the lower threshold of the window comparator is reached the negative output '−' of the comparator is activated. The Pulse logic circuit outputs a pulse to indicate a unit of reverse energy and closes switch S for a set period of time to discharge the capacitor C. Switch S is opened and the process repeats.

One of the disadvantages of this approach is that Direct Current (D.C.) offsets on the IP power signal caused by circuit offsets add or subtract from the measured energy causing system measurement errors. Another disadvantage is the need to use a very low leakage capacitor for the integrating capacitor C to reduce measurement errors caused by the self discharge characteristics of the capacitor. This usually restricts the use of capacitors integrated with the circuit into a silicon chip. One other disadvantage of this approach is the time taken to discharge the capacitor after a unit of energy has been measured again leading, to overall measurement errors.

SUMMARY OF THE INVENTION

The invention preferably provides an electricity meter operative to receive a mains A.C. signal and a first A.C. signal the magnitude of which is dependent on the flow of electrical power through a conductor, comprising a first pulse generating means operative to provide pulses at a rate proportional to the magnitude of the first A.C. signal whilst the mains A.C. signal is positive and a second pulse generating means operative to provide further pulses at a rate proportional to the magnitude of the first A.C. signal whilst the mains A.C. signal is negative the meter including accumulator means to determine from the pulses a first pulse count for the periods whilst the product of the first A.C. signal and the mains A.C. signal is positive and a second pulse count for the periods whilst the product of the first A.C. signal and the mains A.C. signal is negative, the pulse counts providing a measure of energy conducted. The first A.C. signal is an A.C. current signal or an A.C. voltage signal preferably provided by a Hall sensor. The mains A.C. signal is preferably an A.C. mains voltage signal.

The present invention in a preferred embodiment overcomes the above mentioned disadvantages of the prior art. Also, its advantage allows the electronic circuitry and integrator capacitor(s) to be integrated into a silicon chip.

The pulse signals are preferably provided by the first A.C. signal being directed selectably to the first or second pulse generating means. The first pulse generating means is preferably an integrator circuit preferably comprising a first capacitor connected via a first pulse generator to a first accumulator. The second pulse generating means is preferably an integrator circuit preferably comprising a second capacitor connected via a second pulse generator to a second accumulator. When a capacitor is charged to a threshold value it is discharged by a corresponding pulse generator which provides a pulse to a corresponding accumulator.

This charging or discharging has the advantage of producing no errors in integrated charge due to the time taken to discharge the capacitors as compared in the prior art single integrator approach. The effect of self discharging of the integrator capacitors is also eliminated since both capacitors experience the same or similar self discharge rates, especially if integrated into the same silicon chip, and the effects of self-discharge are cancelled.

The present invention also relates to a method of electricity metering including receiving a mains A.C. signal and an A.C. voltage or current signal dependent on electrical power through a conductor, providing first pulses at a rate proportional to the magnitude of the first A.C. signal whilst the mains A.C. signal is positive, and providing second pulses at a rate proportional to the magnitude of the first A.C. signal whilst the mains A.C. signal is negative, counting first and second pulses in the periods whilst the product of the mains A.C. signal and the first A.C. signal is positive to provide a first pulse count and separately counting first and second pulses in the periods whilst the said product is negative to provide a second pulse count, the pulse counts providing a measure of energy conducted.

Automatic detection of forward or reverse energy is advantageously provided where the input A.C. voltage or A.C. current is proportional to instantaneous power. Rather than requiring external capacitors, capacitors integrated with other circuit elements, for example on a silicon chip, can be used since the effect of capacitor self discharge currents are compensated for within the circuit. The circuit has a narrow bandwidth response because it is synchronised with the mains signal frequency which is another advantage.

A preferred embodiment of the present invention will now be described by way of example, with reference to the drawings in which:

DETAILED DESCRIPTION

Figure 1:
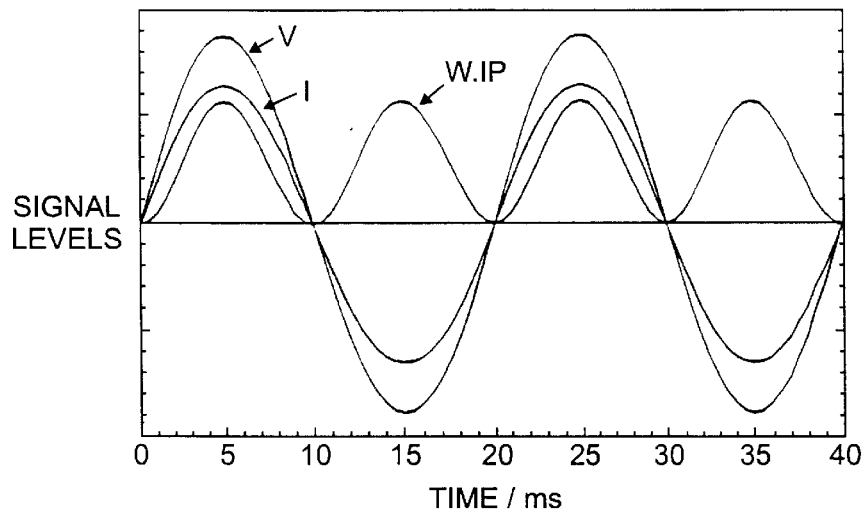
FIG. 1 is a representation of power voltage and current signals applied to an integrator (prior art)
Figure 2:
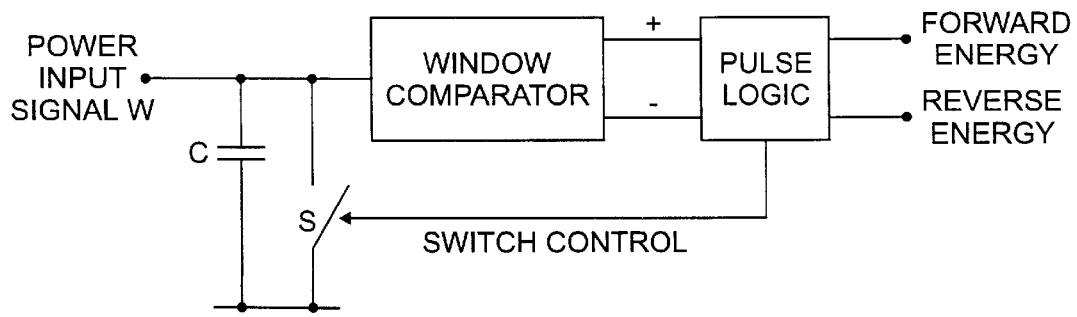
FIG. 2 is a schematic circuit diagram of a known integrator (prior art)
Figure 4:
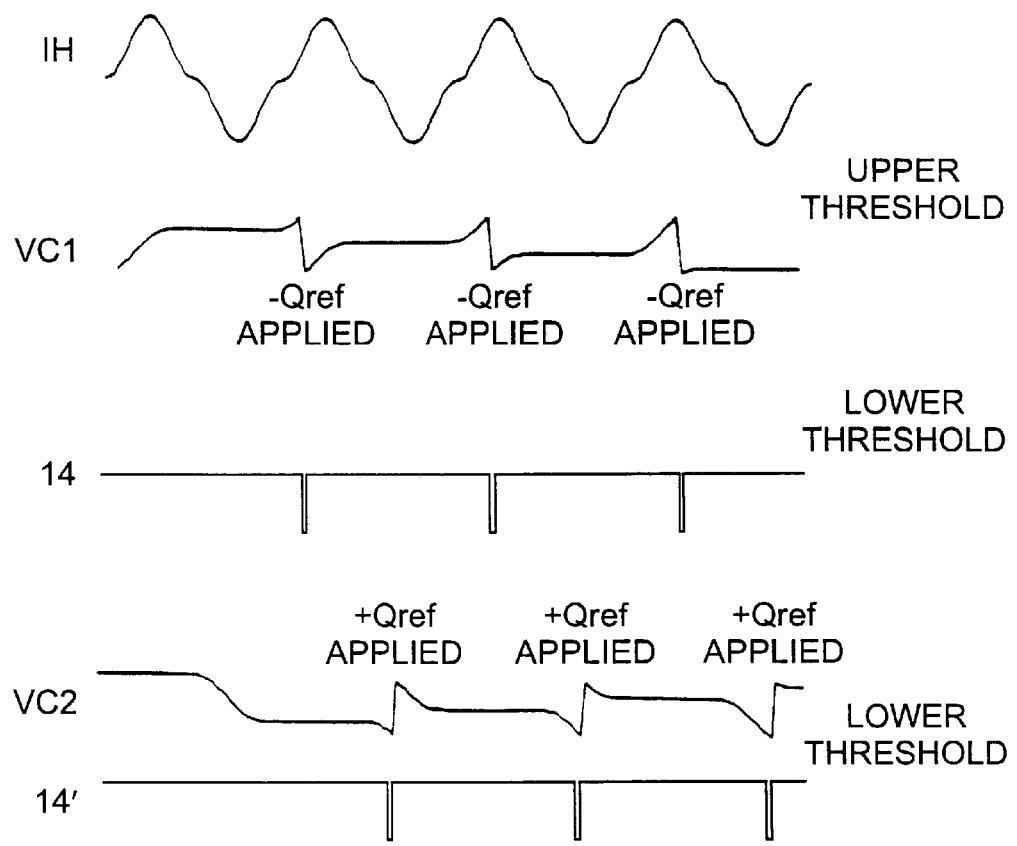
FIG. 4 is a diagram illustrating magnitude of current and voltage signals over time.

This invention uses an instantaneous power signal which differs from the prior art instantaneous power signal shown in FIG. 1 (prior art). The invention measures the power supplied by a conductor which is supplied with a voltage signal V. A power signal IH is produced, as shown in FIG. 4, which represents the instantaneous power for positive half cycles of the voltage signal V, and represents minus the instantaneous power for negative half cycles of the voltage signal V. This alternating signal has the advantage of containing no Direct Current (D.C.) components and hence any errors due to D.C. offsets can be distinguished and removed. The IH waveform can be represented mathematically as a piecewise waveform following:

$$IH = A \sin^2 \emptyset \quad \text{for } \emptyset \text{ in the range } 0\pi$$
$$\quad\quad -A \sin^2 \emptyset \quad \text{for } \emptyset \text{ in the range } \pi \text{ to } 2\pi$$

where A is the maximum amplitude of the IH waveform.

Figure 3:
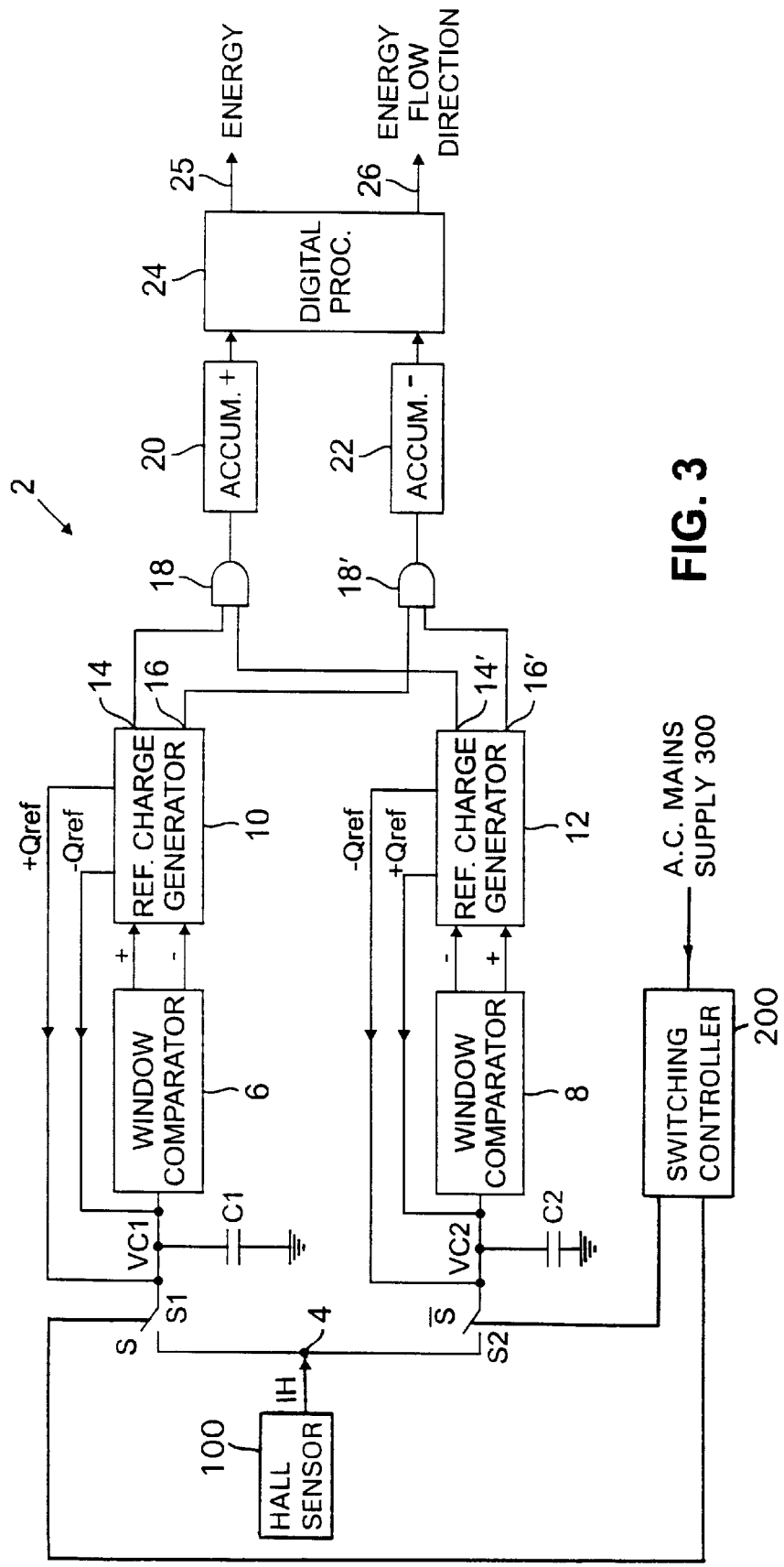
FIG. 3 is a schematic circuit diagram of a preferred circuit according to the present invention.

This alternating power signal IH is applied to the integrator circuit shown in FIG. 3. This circuit contains two integrator circuits configured differentially. The switch S1 is open when S2 is closed and the switch S1 is closed when S2 is open. The switch S1 is closed during the positive half cycles of the voltage signal V and is open during the negative half cycles of the voltage signal V. Hence during positive half cycles of the voltage signal V capacitor C1 has the signal IH applied and during negative half cycles of the voltage signal capacitor C2 has the signal IH applied. When either of the capacitors reach the upper or lower threshold of the window comparators the charge generator either charges or discharges the capacitor with a preset charge and produces either a forward energy or reverse energy pulse to the accumulators.

The Circuit

The preferred input signal is an Alternating Current (A.C.) current from Hall sensor 100, but could alternatively be an A.C. voltage. The A.C. current to frequency conversion circuit 2 shown in FIG. 3, consists of an A.C. current input port 4 connected to a pair of switches, S1, S2. Switch S1 is essentially open when S2 is closed, and vice versa. The switching action of switches S1 and S2 is controlled by switching controller 200 based on AC mains supply 300. Each switch, S1, S2 is connected via a plate of a respective referenced capacitor C1, C2 to a respective window comparator 6, 8. Each window comparator is connected to a corresponding reference charge generator 10, 12. Each reference charge generator 10, 12 can comprise, as will be clear to a person skilled in the art, a charge generator producing a reference charge from a constant current source accumulating over a constant period of time to yield a preset reference charge value. Each reference charge generator 10, 12 has two default positive output ports. Reference charge generator 10 has output ports 14, 16: reference charge Generator 12 has output ports 14', 16'. The output port 14 of one charge generator 10 and the output port 14' of the other charge generator 12 are connected via an AND-gate 18 to positive accumulator 20. The output port 16 of charge generator 10 and the, output port 16' of charge generator 12 are connected via an AND-gate 18' to a negative accumulator 22. Data is provided from the accumulators 20, 22 to digital processing circuitry 24.

Operation

The detailed operation of the circuit is as follows, the comparators and charge generators being, discussed before the accumulator.

Energy consumed follows the integral equation $$E = \int V(t)I(t)dt \quad\quad\quad \text{(Equation 1)}$$

where E is the energy consumed by a circuit element, I(t) is the time varying current flowing through the circuit element, and V(t) is the time varying voltage across the circuit element.

If the voltage and current are in phase (0° phase difference) the product will always be positive and hence the integral will always be positive. Conversely if the voltage and current are in antiphase (180° phase difference) the product will always be negative and hence the integral will always be negative. In practice the phase difference between the voltage and current is some other value. A positive integral is generally referred to as forward energy consumption and a negative integral is generally referred to as reverse energy consumption. This circuit acts to separate the positive and negative integrals to produce information to the digital processing circuitry.

The circuit 2 is supplied with an A. C. Hall current IH from a Hall Sensor 100 as shown in FIG. 4. The Hall sensor 100 detects magnetic field induced in the vicinity of an AC mains supply conductor being metered. When current flows through a conductor, a rotational magnetic field is set up. The magnitude of this magnetic field is proportional to the density of current flowing:

$$B \alpha I/A \quad\quad\quad \text{(Equation 2)}$$

where I is the total current, and A is the cross sectional area of the conductor. This value I/A is the current density J.

Using a Hall effect sensor, the sensor output signal has a voltage, VH, which is proportional to the magnetic field strength B at the sensor, and a bias current IB flowing through the sensor as follows:

$$VH = S \times B \times IB \quad\quad\quad \text{(Equation 3)}.$$

The proportionality coefficient S is the sensitivity of the sensor. By keeping constant the current through the Hall sensor, a linear relationship is achieved between the detected magnetic field and output voltage.

If such a sensor is placed near a conductor, the two equations (2) and (3) above can be combined allowing, current flow to be determined:

$$VH \alpha J \quad\quad\quad \text{(Equation 4)}.$$

The bias current IB is selected to be proportional to the rectified A.C. electricity mains supply voltage. The current IB is a rectified A.C. signal and the detected magnetic field B is an A.C. signal which varies according to a sine relation. According the output voltage VH follows an alternating sine squared relation, namely a piecewise waveform following:

$\sin^2 \emptyset$ for positive half cycles $-\sin^2 \emptyset$ for negative half cycles where Ø is phase being representative of time. This waveform can be expressed mathematically as:

$$VH = A\operatorname{Sin}^2\emptyset \quad \text{for } \emptyset \text{ in the range 0 to } \pi \quad \text{(Equation 5)}$$
$$-A\operatorname{Sin}^2\emptyset \quad \text{for } \emptyset \text{ in the range } \pi \text{ to } 2\pi$$

This waveform can be expressed as:

$$VH = A\operatorname{Sin}^2\emptyset \quad \forall \emptyset\varepsilon[0,\pi) \quad \text{(Equation 6)}$$
$$-A\operatorname{Sin}^2\emptyset \quad \forall \emptyset\varepsilon[\pi,2\pi)$$

where A is a constant and Ø is representative of time following the equation Ø=2πft. with f being a signal frequency in Hertz and t being time in seconds.

Where the symbols have the following meanings:

∀ means "for all values of".

ε means "is in the range".

'[' means from and including the value stated immediately after the bracket. (The mathematical term is a "closed limit").

')' means up to but not including the value stated immediately before the bracket. (The mathematical term is an "open limit").

Therefore, the expression "∀Øε[0,π)" signifies "for all values of Ø in the interval from and including 0 up to but not including π".

The production of the alternating Sin²Ø Hall voltage waveform VH allows simple elimination of any unwanted D.C. voltages in the circuit by filtering out D.C. voltages using a D.C. blocking capacitor. Unwanted D.C. voltages can occur due to Hall effect device D.C. offsets and other D.C. offsets from associated electronic circuits. D.C. voltages on the Hall voltage VH can also be caused by external D.C. magnetic fields. All of these D.C. voltages are simply removed by using a simple D.C. blocking capacitor. The voltage VH is converted to current IH in a known fashion.

During positive half cycles of the A.C. mains voltage, switch S1 is closed and switch S2 is open. The current IH charges the capacitor C1 during this positive half cycle. Depending on the phase difference of the mains voltage and the Hall current IH, the capacitor C1 charges either positively or negatively. The window comparator 6 has two set threshold levels. If the voltage VC1 on the capacitor C1 reaches the upper of the two thresholds of the windows comparator 6 the positive output to the reference charge generator 10 is activated. This causes the reference charge generator 10 to output a −ve discharge −Qref onto capacitor C1 and also to produce a negative going output pulse at a default positive output port 14 to AND-gate 18. If the voltage VC1 reaches the lower of the two thresholds of the window comparator the negative output to the reference charge generator 10 is activated. This causes the reference charge generator 10 to output a +ve charge +Qref to capacitor C1 and also to produce a negative going output pulse at default positive output port 16 to AND-gate 18'.

During negative half cycles of the A.C. mains voltage, switch S1 is open and switch S2 is closed. The current IH charges capacitor C2 during this negative half cycle. Depending on the phase difference of the mains voltage and the current IH, the capacitor C2 will charge either positively or negatively. The window comparator 8 has two set threshold levels. If the voltage VC2 of the capacitor C2 reaches the upper of the two thresholds of the window comparator 8 the positive output to the reference charge generator 12 is activated. This causes the reference charge generator 12 to output a −ve discharge −Qref to capacitor C2 and also to produce a negative output pulse at default positive output port 16' to AND-gate 18'. If the voltage VC2 reaches the lower of the two thresholds of the window comparator 8 the negative output to the reference charge generator 12 is activated. This causes the reference charge generator 12 to output a +ve charge +Qref onto capacitor C2 and also to produce a negative going output pulse at default positive output port 14' to AND-gate 18. The default positive output from port 14 of the reference charge generator 10 is combined via the AND-gate 18 with the default positive output from port 14' of the reference charge generator 12, and the default positive output 16 from reference charge generator 10 is combined via the AND-gate 18' with the default positive output from port 16' of the reference charge generator 12. Hence all pulses due to forward energy are accumulated in the positive accumulator 20 and all pulses due to reverse energy are accumulated in the negative accumulator 22.

During any particular period of time only one of the accumulators will be incrementing since electrical power will be either forward or reverse. An accumulator 20, 22 is incremented every time a pulse is received from one of the AND-gates 18, 18' until a predetermined value N is achieved when an overflow signal is generated to the digital circuitry 24. When the next pulse is received the accumulator which overflowed resets back to zero and the process repeats. In this manner when the output of an accumulator overflows, the overflow signal indicates that a unit of energy proportional to N.Qref has been measured and the digital circuitry 24 can act accordingly. If the positive accumulator 20 overflows this indicates that a unit of forward energy has been measured and the digital circuitry outputs a signal pulse on the energy output 25 to indicate this unit of energy consumption and sets the port 26 indicating the direction of energy output to be high so as to indicate forward energy consumption. If the negative accumulator 22 overflows this indicates that a unit of reverse energy has been measured and the digital circuitry 24 outputs a signal pulse on the energy output port 25 to indicate this unit of energy consumption and sets the port indicating the direction of energy output 26 to be low to indicate reverse energy consumption.

Any self discharge of capacitor C1 or capacitor C2 due to self leakage or loading by other circuitry could lead to energy measurement errors. This effect is substantially cancelled by the use of the two integrators including those capacitors. Since both integrator capacitors C1, C2 are constructed on a single integrated circuit they experience the same or substantially similar self discharge characteristics. For example, for forward energy if the current signal IH is charging capacitor C1 during the positive half cycle of the A.C. mains voltage, the effect of self discharge of capacitor C1 is a reduction in the rate of pulses produced at the pulse generator output port 14 which add to accumulator 20. During the negative half cycle of the A.C. mains voltage, for forward energy, the capacitor C2 is discharged by the current IH and the effect of self discharge of C2 is an increase in the rate of pulses produced at the pulse generator output port 14' which add to accumulator 20. These increases and decreases in pulse generation rates are proportional to the rate of self discharge. The self discharge rate of capacitor C1 will be the same or substantially similar to the self discharge rate of capacitor C2. Hence the decrease in pulse rate on output port 14 is counteracted and cancelled by the increase in pulse rate on output port 14'. Hence the effect of capacitor self discharge is substantially eliminated.

In other embodiments, the rate of increase in the accumulator count indicates power consumption at that time.

The use of the two integrators in the differential mode described above leads to the following advantages. Systematic D.C. errors in the Hall current IH are eliminated by the differential integration. Losses due to integrator discharge times are eliminated by using reference charges Qref. The use of dual integrators has the advantage over a single integrator which uses the same capacitor for integration of both forward and reverse power by not losing any charge during current direction switching. Capacitor self discharge is eliminated due to the differential capacitor arrangement in the integrator since both capacitors exhibit the same rate of self discharge. Forward and reverse energy detection is automatically achieved. Each integrator is locked to mains frequency producing narrow bandwidth performance centred on mains frequency.

I claim:

1. An electricity meter operative to receive a mains A.C. signal and a first A.C. signal the magnitude of which is dependent on electrical power through a conductor, comprising a first pulse generating device operative to provide pulses at a rate proportional to the magnitude of the first A.C. signal while the mains A.C. signal is positive, and a second pulse generating device operative to provide further pulses at a rate proportional to the magnitude of the first A.C. signal while the mains A.C. signal is negative, the meter including accumulator device to determine from the pulses a first pulse count for the periods while the product of the first A.C. signal and the mains A.C. signal is positive and a second pulse count for the periods while the product of the first A.C. signal and the mains A.C. signal is negative, the pulse counts providing a measure of energy conducted, in which the first pulse generating device comprises a first integrator circuit and the second pulse generating device comprises a second integrator circuit, and in which the first integrator circuit comprises a first capacitor connected to a first pulse generator, and the second integrator circuit comprises a second capacitor connected to a second pulse generator.

2. An electricity meter according to claim 1, in which if the first A.C. signal is positive, while the mains A.C. signal is positive, pulses are produced at a first output port, and if the first A.C. signal is negative while the mains A.C. signal is positive, pulses are produced at a second output port, and if the first A.C. signal is negative while the mains A.C. signal is negative, pulses are produced at a third output port and if the first A.C. signal is positive while the mains A.C. signal is negative, pulses are produced at a fourth output port, the pulses from first and third output ports being counted in a first accumulator of the accumulator device and the pulses from the second and fourth output ports being counted in a second accumulator of the accumulator device.

3. An electricity meter according to claim 1, in which the first A.C. signal is an A.C. current signal or an A.C. voltage signal.

4. An electricity meter according to claim 1, in which the first A.C. signal is provided by a sensor which produces a signal dependent upon the instantaneous power conducted.

5. An electricity meter according to claim 4, in which the sensor is a Hall-effect sensor operative to detect the magnitude of a magnetic field induced by electricity flow through a mains conductor.

6. An electricity meter according to claim 1, in which the first A.C. signal follows a sine-squared relation with alternating positive and negative sign in each half cycle.

7. An electricity meter according to claim 1, in which the mains A.C. signal is the alternating voltage signal of an electrical supply network to which the conductor is connected.

8. An electricity meter according to claim 1, further comprising a switch device to selectably direct the first A.C. signal to the first pulse generating device or second pulse generating device dependent on the polarity of the mains A.C. signal.

9. An electricity meter according to claim 1, in which the first capacitor and second capacitor are constructed on a single integrated circuit.

10. An electricity meter according to claim 2, in which at a plurality of predetermined time pulses counts accumulated in the two accumulators are summed to provide a measure of total energy conducted.

11. An electricity meter according to claim 2, in which upon the first capacitor being charged to a first threshold value, the first capacitor is discharged by the first pulse generator which provides a pulse to the first accumulator.

12. An electricity meter according to claim 2, in which upon the first capacitor being discharged to a second threshold value lower than the first threshold value, the first capacitor is charged by the pulse generator which provides a pulse to the second accumulator.

13. An electricity meter according to claim 2, in which upon the second capacitor being charged to a third threshold value, the second capacitor is discharged by the second pulse generator which provides a pulse to the second accumulator.

14. An electricity meter according to claim 2, in which upon the second capacitor being discharged to a fourth threshold value lower than the third threshold value the second capacitor is charged by the second pulse generator which provides a pulse to the first accumulator.

15. An electricity meter according to claim 1, in which the first pulse count represents forward energy and the second pulse count represents reverse energy.

16. A method of electricity metering including receiving a mains A.C. signal and an A.C. voltage or current signal dependent on electrical power through a conductor, providing first pulses at a rate proportional to the magnitude of the first A.C. signal whilst the mains A.C. signal is positive, and providing second pulses at a rate proportional to the magnitude of the first A.C. signal whilst the mains A.C. signal is negative, counting first and second pulses in the periods whilst the product of the mains A.C. signal and the first A.C. signal is positive to provide a first pulse count and separately counting first and second pulses in the periods whilst the said product is negative to provide a second pulse count, the pulse counts providing a measure of energy conducted, in which the first pulses are provided by a first integrator circuit comprising a first capacitor and the second pulses are provided by a second integrator circuit comprising a second capacitor.

17. A method of electricity metering according to claim 16, in which the first A.C. signal is dependent upon magnitude of a magnetic field induced in a region around a mains conductor, the magnetic field being dependent on electricity flow and being detected by a sensor which provides the first A.C. signal.

18. A method of electricity metering according to claim 17, in which the sensor is a Hall sensor.

19. A method of electricity metering according to claims 16, in which the first A.C. signal follows a sine-squared relation with alternating positive and negative sign in each half cycle.

20. An electricity meter operative to receive a mains A.C. signal and a first A.C. signal the magnitude of which is dependent on the flow of electrical power through a conductor, comprising a first pulse generating device operative to provide a first pulse signal having a pulse rate proportional to the magnitude of the first A.C. signal while the first A.C. signal and mains A.C. signal are positive and a second pulse signal having a pulse rate proportional to the magnitude of the first A.C. signal while the first A.C. signal is negative and the mains A.C. signal is positive, and a second pulse generating device operative to provide a third pulse signal having a pulse rate proportional to the magnitude of the first A.C. signal while the first A.C. signal is negative and mains A.C. signal is negative and a fourth pulse signal having a pulse rate proportional to the magnitude of the first A.C. signal while the first A.C. signal is positive and the mains A.C. signal is negative, the meter including accumulator device to determine a first pulse count from the first and third pulse signals for the periods while the product of the first A.C. signal and the mains A.C. signal is positive and a second pulse count for the second and fourth pulse signals for the periods while the product of the first A.C. signal and the mains A.C. signal is negative, the pulse counts providing a measure of energy conducted, in which the first pulse generating device comprises a first integrator circuit and the second pulse generating device comprises a second integrator circuit, and in which the first integrator circuit comprises a first capacitor connected to a first pulse generator, and the second integrator circuit comprises a second capacitor connected to a second pulse generator.

* * * * *